United States Patent [19]
Honjyo et al.

[11] 4,315,254
[45] Feb. 9, 1982

[54] SELF-COMPENSATING A-D CONVERTER

[75] Inventors: Jun Honjyo; Yukimitsu Watanabe, both of Gyoda, Japan

[73] Assignee: Takeda Riken Kogyo Kabushiki Kaisha, Japan

[21] Appl. No.: 111,303

[22] Filed: Jan. 11, 1980

[51] Int. Cl.³ .............................................. H03K 13/02
[52] U.S. Cl. ......................... 340/347 CC; 340/347 M; 340/347 AD
[58] Field of Search .... 340/347 M, 347 CC, 347 AD, 340/347 NT; 324/99 D; 73/362 AR

[56] References Cited
U.S. PATENT DOCUMENTS

| | | | |
|---|---|---|---|
| 3,654,560 | 4/1972 | Cath et al. | 340/347 NT X |
| 3,790,910 | 2/1974 | McCormack | 364/573 X |
| 4,070,665 | 1/1978 | Glennon et al. | 340/347 M X |
| 4,119,958 | 10/1978 | Simon et al. | 318/604 X |

*Primary Examiner*—Thomas J. Sloyan
*Attorney, Agent, or Firm*—Staas & Halsey

[57] ABSTRACT

An A-D converter in which an input analog signal is converted by a first A-D converting circuit into a digital signal to obtain a high-order digit output, the high-order digit output is re-converted by a D-A converting circuit into an analog signal and the difference between the re-converted analog signal and the input analog signal is amplified and then converted by a second A-D converting circuit into a digital signal. An ideal voltage which would be produced when the input to the D-A converting circuit is separately applied for each bit of the D-A converting circuit is provided from a reference voltage source. The difference between the output derived from the D-A converting circuit in response to the application of the input thereto for each bit and the voltage of the reference voltage source corresponding to the D-A converting circuit output is converted by the second A-D converting circuit into a digital signal, so that an error signal is obtained. The low-order bit output is corrected using the error signal.

9 Claims, 5 Drawing Figures

SELF-COMPENSATING A-D CONVERTER

BACKGROUND OF THE INVENTION

This invention relates to an A-D converter in which an input analog signal is converted into a digital signal to obtain digital outputs comprising high-order digits, the digital output is re-converted into an analog signal, the difference between the re-converted analog signal and the input analog signal is amplified and converted into a digital signal to obtain digital outputs comprising low-order digits, so that a highly accurate conversion is performed.

In this kind of A-D converters, for achieving conversion with high accuracy, it is necessary that the D-A converter for re-converting the high-order digit output be stable and highly accurate. However, such a D-A converter requires resistors having high accuracy and stability. At present these are expensive and bulky winding resistors. Additional bulky winding resistors (the same number as the high-order digits to be converted) must also be provided, resulting in the A-D converter becoming costly as a whole. Further, in an amplifier for amplifying the difference between the analog signal re-converted from the high-order digits and the input signal, an offset, that is, an output even in the absence of an input to the amplifier, is caused. If the offset is constant, its influence can easily be removed; but the offset varies with an ambient temperature change and with the lapse of time, that is, the offset drifts, so that an error is introduced in the digital converted output. Moreover, if the gain of the amplifier for amplifying the difference between the input analog signal and the analog converted output of the high-order digit output varies with an ambient temperature change and with the lapse of time, then no correct digital output can be obtained.

SUMMARY OF THE INVENTION

It is an object of this invention to provide an A-D converter which is capable of achieving an A-D conversion with high accuracy and which can be constructed at low cost.

Another object of this invention is to provide an A-D converter which is capable of achieving an A-D conversion with high accuracy through utilization of an inexpensive D-A converter.

Another object of this invention is to provide an A-D converter which produces an accurate converted output even if the offset varies.

Another object of this invention is to provide an A-D converter which is capable of achieving a correct conversion even if the gain varies.

Yet another object of this invention is to provide an A-D converter which does not strictly require high accuracy in the conversion by a D-A converter, that is, does not require accurate prior calibration, but is capable of producing a converted output with high accuracy, which is able to produce a converted output with high accuracy even if the stability of the D-A converter is relatively low and which can be constructed at a low cost as a whole.

According to the present invention, there is provided a reference voltage source for generating a reference voltage, corresponding to an ideal output derived from a D-A converter for converting high-order digits in the converted digital output into analog signals, when conversion bits of the D-A converter are individually inputted thereto. Prior to the converting operation, the bits of the D-A converter are inputted one by one, and the difference between the output from the D-A converter and the reference voltage corresponding to the inputted bit is converted into digital form under the same condition as exists when low-order digits of the digital output are obtained. In this way, when each bit is inputted to the D-A converter, an error is obtained, as a digital signal, and this digital signal is added as a correction signal to the low-order digits of the converted digital signal.

With such an arrangement, the D-A converter can be an inexpensive one which is not very high in conversion accuracy. That is, even if the converted output does not coincide exactly with the input digital signal, it is ensured that the A-D conversion is performed with high accuracy since a correction signal is predetermined and is then used to correct the converted output from the D-A converter. In order to obtain a correct correction signal, a high accuracy reference voltage source is required, but the number of high accuracy and stability resistors required for the D-A converter may be smaller than in the case of employing the high accuracy D-A converter. Since the A-D converter itself involves a reference voltage source for the A-D converting operation, the required reference voltages can be obtained by adding a few resistors to the reference voltage. Thus, the reference voltage source can be obtained easily and at low cost compared to the case of employing a highly accurate D-A converter.

The calibration for the D-A converter may also be effected prior to each converting operation, or in order to perform calibration for each bit of the D-A converter, it is also possible to obtain a correction signal for one bit for each A-D converting operation and to sequentially shift the calibration bits for each A-D converting operation. Furthermore, it is possible to obtain a new correction signal at regular time intervals, for example, every several seconds, by alternately performing one of the measurements of the correction signal, the gain and the offset including the correction of a drift of each amplifier and the operation for converting the input signal to digital form. The control therefore can always be achieved automatically by program control using a microcomputer, and even if use is made of inexpensive low stability resistors as the resistors of the D-A converter, a stable, high accuracy digital converted output can be provided at all times.

DESCRIPTION OF THE PREFERRED EMBODIMENTS

Figure 1:
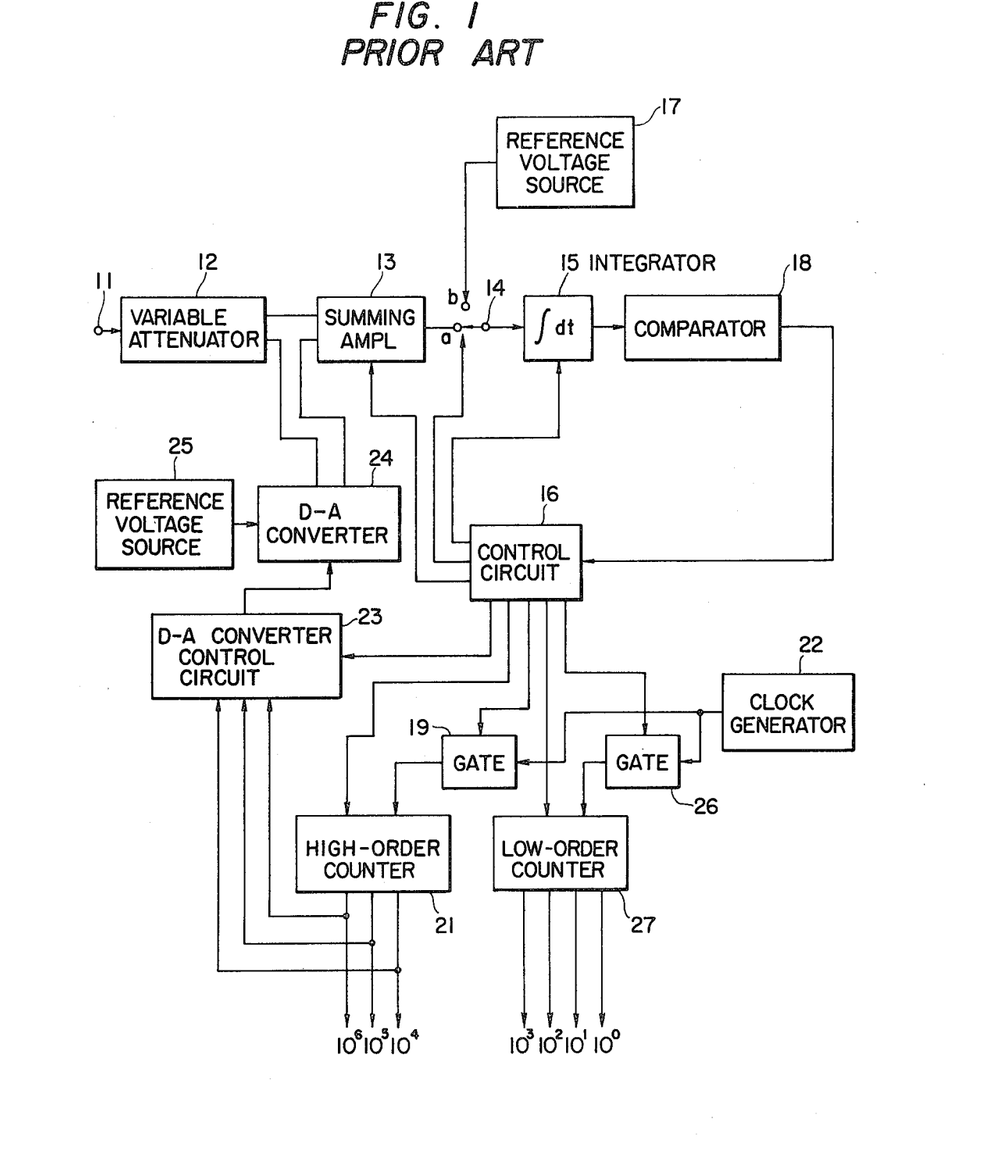
FIG. 1 is a block diagram illustrating a conventional A-D converter.

In order to provided a better understanding of the present invention, a description will first be made, with reference to FIG. 1, of the kind of A-D converter heretofore employed. An input analog signal $E_x$ applied to an input terminal 11 is supplied, via an input variable attenuator 12, to a summing amplifier 13, whose output is provided to an integrator 15 via a contact "a" of a changeover switch 14. In the integrator 15, the input analog signal value is integrated for a certain period of time. Thereafter, the change-over switch 14 is changed over, under the control of a control circuit 16, to the side of a reference voltage source 17, that is, to a contact "b", and a reference voltage $E_{r1}$ of the reference voltage source 17 is integrated. This integration is carried out in the polarity opposite to that in which the input analog signal supplied via the contact "a" is integrated, and the output from the integrator 15 is provided to a comparator 18 for comparison with a reference value, for example, zero potential. When the integrated value has reached the reference value, this is detected by the control circuit 16, and the integrating operation of the integrator 15 is stopped by the control circuit 16.

In the period during which the voltage of the reference voltage source 17 is integrated, that is, in the so-called second integration period, the control circuit 16 opens a gate 19 to pass therethrough clock pulses from a clock generator 22 to a high-order digit counter 21. For example, three digits of the count value of the high-order digit counter 21 are provided as high-order converted outputs. A D-A converter control circuit 23 is controlled by the control circuit 16, so that the high-order three digit outputs converted to digital form as described above are re-converted to analog form in a D-A converter 24. A reference voltage $E_{r2}$, for this conversion, is supplied from a reference voltage source 25 to the D-A converter 24. The re-converted analog output from the D-A converter 24 is applied to the summing amplifier 13, wherein it is compared with the input analog signal from the input variable attenuator 12 to detect the difference therebetween.

The difference output between the input analog signal and the re-converted analog signal is amplified by the summing amplifier 13 to a desired level. The amplification gain for this operation is controlled by the control circuit 16 so that it is larger than the gain for the conversion for obtaining the above-mentioned high-order digit outputs. The analog difference output thus amplified is provided via the contact "a" of the change-over switch 14 to the integrator 15, wherein it is integrated for a certain period of time. Thereafter, the reference voltage from the reference voltage source 17 is integrated in the reverse direction, and the integration is carried out until the integrated output reaches a predetermined level. During the integration of the reference voltage, the gate 26 is opened by the control circuit 16, which passes therethrough clock pulses from the clock generator 22 to a low-order digit counter 27, wherein they are counted. Four digits of the count value of the low-order digit counter 27 are provided as four low-order digits of a converted output digital signal. The four-digit output and the three-digit output are combined to form a seven-digit digital output.

If the A-D conversion for obtaining the digital outputs of the high-order digits, as described above, is conducted, for example, with the attenuation of the variable attenuator 12 selected to be 0, so that the input analog signal is applied directly to the summing amplifier 13 from the input terminal 11, and the gain of the summing amplifier 13 selected to be 1 to derive at its output the input analog signal as it is, then 12.300 V is obtained as the converted outputs of the high-order digits if the input voltage $E_x$ is 12.34567 V. That is, the high-order digit counter 21 is formed by three digits of a binary-coded decimal counter, and the values of the three digits are respectively represented, in a descending order of significance, by 1, 2 and 3 in the decimal notation.

Then, the count value 12.3 of the high-order digit counter 21 is converted by the D-A converter 24 into an analog signal, and the difference between it and the input analog signal $E_x$ is amplified by the summing amplifier 13. The amplification factor of the summing amplifier 13 is selected to be, for example, 100 so that the summing amplifier 13 outputs 4.567 V, which is converted into a digital signal, as described previously. The low-order digit counter 27 is formed by four digits of a binary-coded decimal counter, and their values are, in decreasing order of significance, 4, 5, 6 and 7 in the decimal system; these values are the converted outputs of the low-order digits. In the digital conversion for the low-order digits, since the gain of the summing amplifier 13 is selected to be 100, the count value of the low-order digit counter 27 is 1/100 of its correct value; namely, 0.04567. The sum of the four-digit output 0.04567 from the low-order digit counter 27 and the three-digit output 12.3 from the high-order digit counter 21 is obtained as a digital output value 12.34567 V for the input analog signal $E_x$.

In such an A-D converter, the accuracy of conversion of the D-A converter 24 is required to be the same as the accuracy of the least significant digit in the A-D conversion of the low-order digits, and for the conversion of the seven digits in the above example, the accuracy is required to be 1 ppm. To meet such a requirement, it is necessary that each of the resistors forming the D-A converter 24 provides a corresponding highly accurate resistance value and that the stability of the resistance value is also high. Further, the resistance values of the resistors, each corresponding to one bit of the input digital signal in the D-A converter 24, must be calibrated for each bit to obtain a correct converted output. This calibration is timeconsuming. In addition, the overall accuracy and stability of the operation of the A-D converter are greatly affected by the stability of each of the resistors of the D-A converter 24 and are the sum total of their stability; however, it is difficult to maintain a high degree of stability for a long time.

Figure 2:
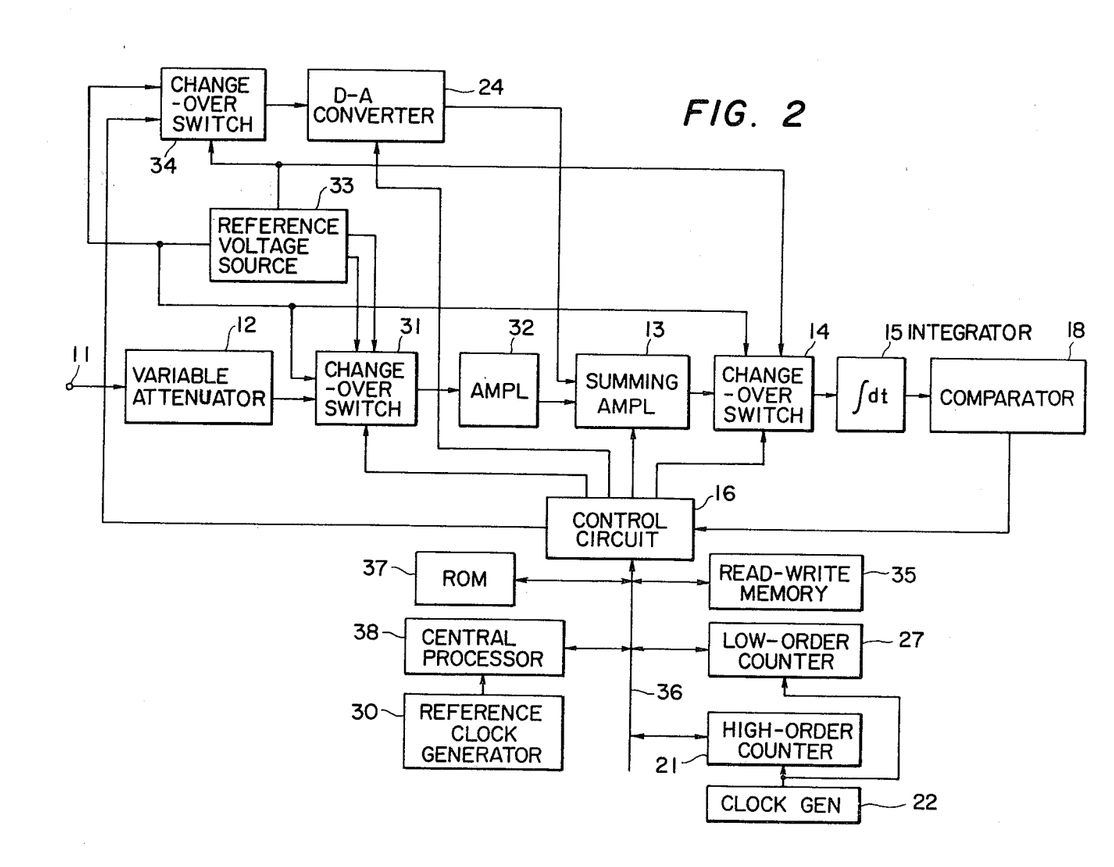
FIG. 2 is a block diagram showing an embodiment of the A-D converter of the present invention.

FIG. 2 illustrates in block form an embodiment of this invention. The input analog signal applied to an input terminal 11 is provided via a variable attenuator 12 and a change-over switch 31 to an amplifier 32, wherein it is amplified. The amplified output is supplied via summing amplifier 13 and a change-over switch 14 to an integrator 15, wherein it is integrated for a certain period of time. Thereafter, the change-over switch 14 is changed over to the side of the reference voltage from a reference voltage source 33, and the reference voltage was integrated by the integrator 15 in the direction opposite to that in which the input analog voltage was integrated. When the integrated output has reached a predetermined value, it is detected by a comparator 18. While the reference voltage is integrated, a high-order digit counter 21 counts the number of clock pulses generated from a clock generator 22 to provide high-order digits of the digital output into which the input analog signal is converted.

The high-order digit digital output signal is provided via a change-over switch 34 to a D-A converter 24 for re-conversion into analog form. The difference between the re-converted output and the input analog signal applied from the input terminal 11, via the amplifier 32 to the summing amplifier 13, is detected therein. The difference output is supplied via the change-over switch 14 to the integrator 15, wherein it is integrated for a certain period of time. Thereafter, the change-over switch 14 is changed over to the side of the reference voltage source 33, and the reference voltage is integrated by the integrator 15 until its output reaches a certain level. During the integration of the reference voltage, clock pulses from the clock generator 22 are counted by low-order digit counter 27 to provide low-order digits of the digital output into which the input analog signal is converted.

The reference voltage source 33 is constructed so as to produce a reference voltage having exactly the same value as an ideal converted analog output voltage which is derived from the D-A converter 24 when an input is applied thereto for one of its bits. The difference between the converted output from the D-A converter 24, when the input is applied thereto for only one of its bits, and the reference voltage of the reference voltage source 33 corresponding to the converted output, is obtained by the summing amplifier 13. This difference is converted by the converting operations of the integrator 15 and the comparator 18 into a digital signal. In other words, an error component of the converted output for each bit of the D-A converter 24 is converted into a digital signal, which is retained as a correction signal. Such a correction signal is obtained for each bit in the D-A converter 24 and is stored, for example, in a read-write memory 35. The correction signals thus obtained are added to the low-order digits in the digital converted output for the input analog signal, thereby to correct the low-order digit output.

This embodiment is adapted so that the aforementioned control is performed using a microcomputer. A read-only memory 37 has stored therein a control program and is connected to a bus 36. The program stored in the memory 37 is read, decoded and executed by a central processor 38 to control the switches 31, 14 and 34, detect the reversal of the output from the comparator 18 and control the gain of the summing amplifier 13 through the control circuit 16. Further, the counting operations of the counters 21 and 27 are also similarly controlled. The calibrated correction signal for the input of each bit in the D-A converter 24 is prestored, for example, in the read-write memory 35, and the correction signal is used for the correction of the low-order digits in the digital converted output derived from the counter 27, thereby providing a correct converted output. The counters 21 and 27 may also be formed using a part of the read-write memory 35 or a general purpose register in the central processing unit 38. In this case, the clock generator 22 is omitted and a latch circuit is connected to the bus 36 for outputting the counted result. The central processor unit 38 operates on the output from the reference clock generator 30.

Figure 3:
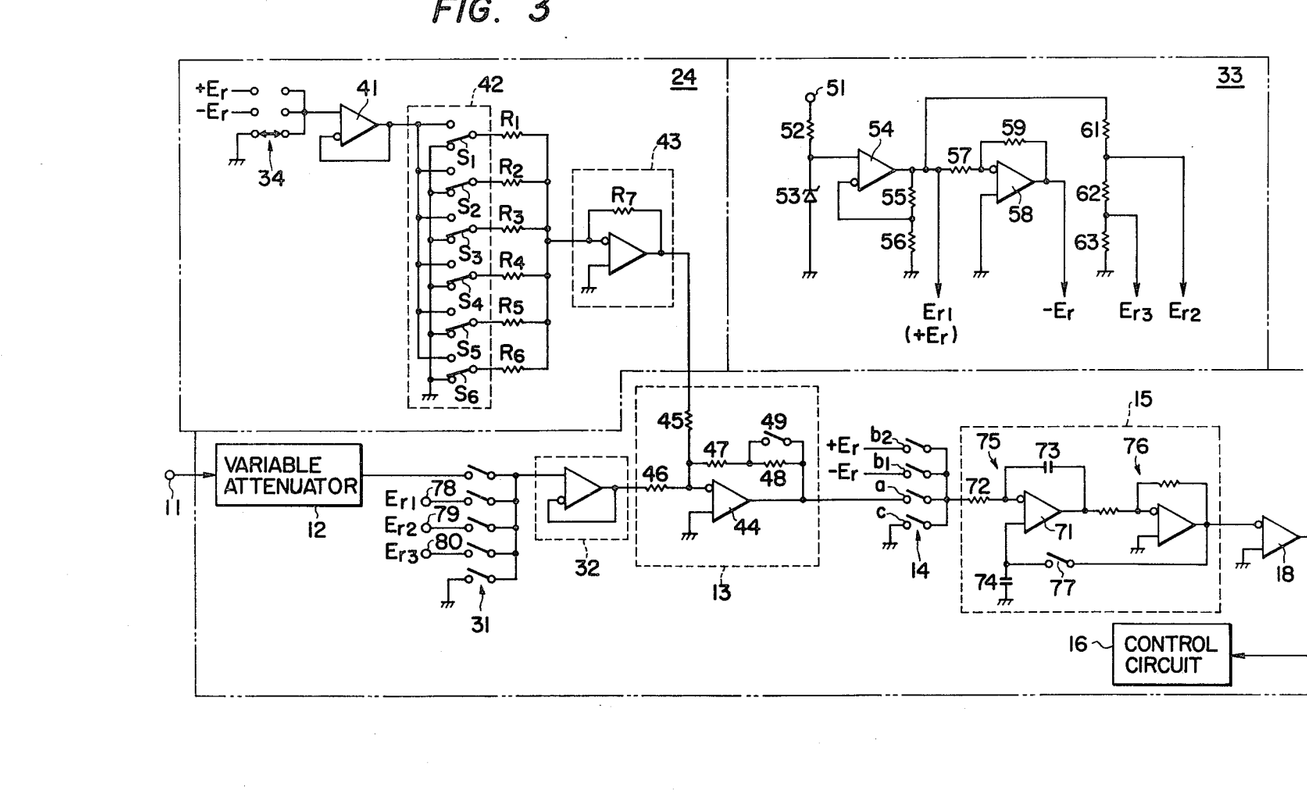
FIG. 3 is a circuit diagram showing, in detail, examples of the respective parts of the A-D converter depicted in FIG. 2.

FIG. 3 shows specific examples of the respective parts of the embodiment depicted in FIG. 2. However, for convenience, the A-D converter shown in FIG. 3 is arranged so that the number of high-order digits to be D-A converted may be two, and the maximum value may be, for example, 11. That is, the high-order digit output which can be supplied to the D-A converter 24 is in the range of 1 to 11. In the D-A converter 24, the reference voltage $-E_r$ or $+E_r$ can be selected, for example, by the change-over switch 34 in dependence upon the zero potential and the polarity of the input voltage, and the reference voltage thus selected is provided via a buffer circuit 41 to a switching circuit 42 which is controlled by a digital signal to be converted. That is, in the switching circuit 42, change-over switches $S_1$ to $S_6$ are provided respectively corresponding to the respective bits of the input digital signal, and these switches $S_1$ to $S_6$ are connected so that they are each connected to the ground side or the output side of the buffer circuit 41 in dependence upon whether the corresponding bit of the input digital signal is "0" or "1". Moving members of the change-over switches $S_1$ to $S_6$ are connected to an adder 42 via resistors $R_1$ to $R_6$, respectively.

The output from the adder 43 is applied as the output of the D-A converter 24 via a resistor 45 to the inverted input side of an operational amplifier 44 forming the summing amplifier 13. To the inverted input side of the operational amplifier 44, the output from an amplifier 32 via a resistor 46 is also supplied. The inverted input side and the output side of the operational amplifier 44 are interconnected via a series circuit of resistors 47 and 48. A switch 49 is connected across the resistor 48. The closure and opening of switch 49 respectively cause a decrease and an increase in the gain of the summing amplifier 13. By controlling the switch 49 to open and close it, the gain of the summing amplifier 13 is varied, for example, 100-fold. The change-over switch 14 is selectively connected to a grounded contact "c," a contact "a" supplied with the output from the amplifier 13, a contact "$b_1$" supplied with the reference voltage $-E_r$ and a contact "$b_2$" supplied with the reference voltage $+E_r$. The moving member of the change-over switch 14 is connected via a resistor 72 to the inverted input side of an operational amplifier 71 in the integrator 15. An integrating capacitor 73 is connected between the inverted input side and the output side of the operational amplifier 71, the non-inverted input side of which is grounded via a capacitor 74 for offset compensation purpose. The operational amplifier 71, the resistor 72 and the capacitor 73 constitute an integrating stage 75, the output of which is applied to a buffer inverting amplification stage 76, having an output which, in turn, is provided to the comparator 18. Further, the output side of the amplifying stage 76 is connected via a normally open switch 77 to the non-inverted input side of the operational amplifier 71. From the moment when the switch 14 is connected to the contact "$b_1$" or "$b_2$" to complete the second integration period for the integration of the reference voltage, to the moment when the switch 14 is connected to the contact "a" to start the first integration period for integrating the input analog signal for a certain period of time, the switch 14 is connected to the contact "c" and the switch 77 is held in the ON state, thereby charging an offset voltage for the operational amplifier 71 across the capacitor 74. At the start of the first integration period, the switch 77 is turned OFF. In this way, the influence of the offset voltage of the operational amplifier 75 is eliminated.

The change-over switch 31 is actuable between the output of the input variable attenuator 12 and ground, and in addition, in the present embodiment, it can be connected to the terminal at which is derived a reference voltage of the same voltage value as an ideal output which is yielded when a selected one of the bits in the D-A converter 24 is inputted. In other words, any one of terminals 78, 79 and 80 which are respectively supplied with reference voltages $E_{r1}$, $E_{r2}$ and $E_{r3}$ is connected by the change-over switch 31 to the input side of the amplifier 32. The amplifier 32 is a buffer for raising the input impedance.

In the reference voltage source 33, a power source terminal 51, which is supplied with, for example, a positive voltage, is grounded via a resistor 52 and a Zener diode 53. At the connection point between the resistor 52 and the Zener diode 53, a constant voltage dependent on the Zener voltage of the Zener diode 53, is obtained. The constant voltage is provided to the non-inverted input side of the operational amplifier 54, the output side of which is grounded via a series connection of resistors 55 and 56. The connection point of the resistors 55 and 56 is connected to the inverted input side of the operational amplifier 54. The output side of the operational amplifier 54 is connected via a resistor 57 to the inverted input side of an operational amplifier 58. Between the inverted input side and the output side of the operational amplifier 58 is connected a resistor 59, and the non-inverted input side of operational amplifier 58 is grounded. Furthermore, the output side of the operational amplifier 54 is grounded via a series circuit of resistors 61, 62 and 63. At the output side of the operational amplifier 54 the reference voltage $E_{r1} = +E_r$ is provided, and at the output side of the operational amplifier 58 the reference voltage $-E_r$ is yielded. Moreover, the reference voltages $E_{r2}$ and $E_{r3}$ are obtained at the connection point of the resistors 61 and 62 and at the connection point of the resistors 62 and 63, respectively. As an example, the reference voltages are, as follows: $E_{r1} = 10$ V, $-E_r = -10$ V, $E_{r2} = +2$ V and $E_{r3} = +1$ V.

Figure 4:
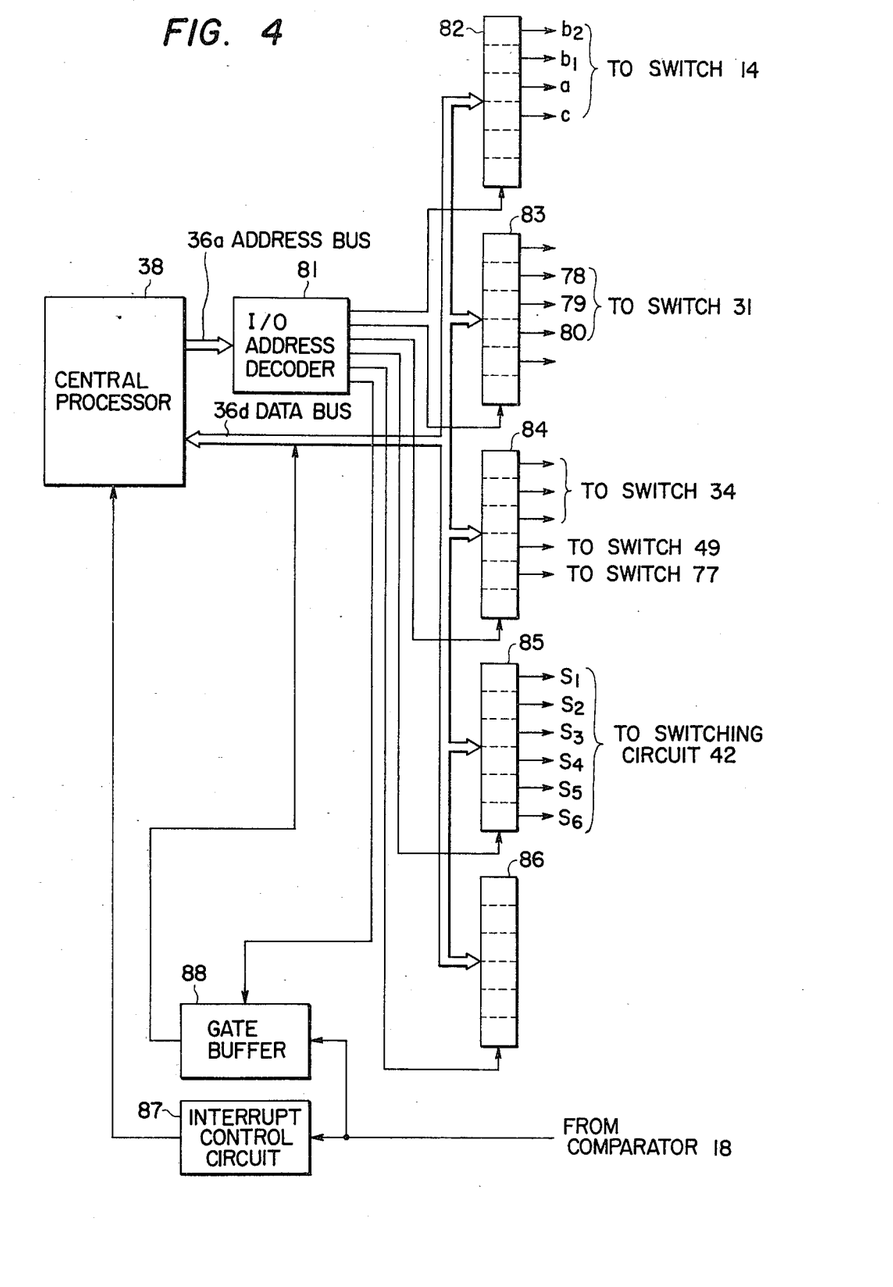
FIG. 4 is a block diagram illustrating a part of a control circuit 16 used in the A-D converter shown in FIG. 2.

The control circuit 16 has a construction such as that shown in FIG. 4. An input/output select address is provided via an address bus 36a to an input/output address decoder 81 from the central processor 38. In accordance with the address applied to the input/output address decoder 81, an input/output unit is actuated. That is, by the output from the input/output address decoder 81, for example, one or more of latch circuits 82 to 86 are selected, and in the selected latch circuits, latched data is provided via a data bus 36d from the central processor 38 at that time. From the data bus 36d, 8 bit parallel data, for example, is latched in one latch circuit. The first to fourth bits of the latch circuit 82 are control data for the switch 14 and respectively correspond to the contacts "$b_2$", "$b_1$", "a" and "c" of the switch 14; for example, when the switch 14 is connected to the contact "$b_2$", the first to sixth bits of the latch circuit 82 have the contents 1, 0, 0, 0, 0 and 0. In FIG. 3, the switches 14, 31, 34 and 42 are each usually formed by an electronic switch using, for example, a field effect transistor. The first to fifth bits of the latch circuit 83 respectively correspond to the change-over contacts of the switch 31; the first to third, fourth and fifth bits of the latch circuit 84, respectively correspond to the three change-over contacts of the switch 34 and the switches 49 and 77; the first to sixth bits of the latch circuit 85 respectively correspond to the switches $S_1$ to $S_6$ of the switching circuit 42. The latch circuit 86 is provided for another input/output part. The output from the comparator 18 is applied to an interrupt control circuit 87, and when the state of the output from the comparator 18 changes, an interrupt is applied to the central processor 38. Upon detection of the interrupt, the central processor 38 provides an address to the address decoder 81, the output of which is applied to a gate buffer 88 to control it, transferring the content of the comparator 18 to the central processor 38 via a data bus 36d.

In FIG. 3, when converting the output from the summing amplifier 13 into a digital signal in the state when the change-over switch 31 is held on the ground side, the input switches $S_1$ to $S_6$ of the D-A converter 24 are all held on the ground side and the switch 49 is in the OFF state, there is obtained an overall offset value of the amplifiers 32 and 43 and the summing amplifier 13 in the A-D conversion of the low-order digits. The digital converted output of the offset voltage $V_{of}$ is stored in the memory 35. Further, in this state, the input side of the amplifier 32 is connected a predetermined reference voltage. For example, the change-over switch 31 is connected to the terminal supplied with the reference voltage $E_{r3}$, and the output from the summing amplifier 13 is converted into a digital signal. From the converted output thus obtained the prestored offset value $V_{of}$ is subtracted, and the resulting difference is divided by the reference voltage $E_{r3}$, to obtain the gain of the summing amplifier 13. The gain $G_1$ thus obtained is stored in the memory 35.

The conversion of the output from the summing amplifier 13 into digital form is performed in the following manner. At first, the switch 14 is connected to the contact "a" for a certain period of time, during which the output from the summing amplifier 13 is integrated by the integrator 15. The progress of the above-mentioned certain period of time is detected by counting clock pulses in the central processor 38. In this first integration period, the gate buffer 88 in FIG. 4 is controlled to place the output from the comparator 18 in the central processor 38, wherein it is decided whether the comparator output is high or low in level, thereby to detect the polarity of the output from the summing amplifier 13. Upon completion of the first integration period, a reference voltage, reverse in polarity of the output from the summing amplifier 13, is integrated, with the switch 14 held on the contact "$b_1$" or "$b_2$". At the same time, the counting operation of the counter 21 or 27 is started. The counters 21 and 27 may also be formed utilizing a part of the read-write memory 35, as mentioned previously. Upon reversal of the output from the comparator 18, an interrupt is applied to the central processor 38 to stop the counting operation of the counter, and the count value of the counter at that time represents the digital converted value of the output from the summing amplifier 13.

In the present embodiment, the D-A converter 24 has two kinds of weights; for example, the switch $S_1$ is weighted with 1 and the switches $S_2$ to $S_6$ are weighted with 2. Accordingly, resistors $R_2$ to $R_6$ are given the same resistance value and their resistance values are selected to be equal to one-half of the resistance value of the resistor $R_1$. The switches $S_1$ to $S_6$ are selectively controlled in accordance with the digital input to be converted to derive an analog signal at the output side of the operational amplifier 43. For a digital input to each one of the input bits of the D-A converter 24, an error in the analog output signal with respect to a correct reference voltage is obtained bit by bit. To perform this calibration, in the switching circuit 42, only the switch $S_1$ corresponding to the first bit of the digital input is connected to the amplifier 41; the switch 34 is connected to the terminal for the reference voltage $E_r$; the change-over switch 31 is connected to the terminal 80 for the reference voltage $+E_{r3}$; and the switch 49 is turned OFF. The output available from the summing amplifier 13 is then converted to digital form. If the D-A converter 24 outputs a correct value in an ideal state and if no offset occurs in any parts, then the output from the summing amplifier 13 is 0; namely, the output from the D-A converter 24 is $E_{r3}$. If, however, the converted output from the D-A converter deviates a little from the correct value $E_{r3}$, an error in the converted output corresponding to the first form, and stored as $V_1$ in the memory 35. From this value $V_1$ is subtracted the aforementioned offset value $V_{of}$, and the difference is divided by the gain $G_1$ obtained previously. The result of this division, $(V_1-V_{of})/G_1$, is an error, with respect to an ideal value, in the output derived from the D-A converter 24 when the input to the switching circuit 42 is connected only to the switch $S_1$. This error may be stored in the memory 35. A value $V_{a1}$ which results when this error is subtracted from the reference voltage $E_{r3}$, represents the analog output available from the D-A converter 24 when the input to the switching circuit 42 is connected to the switch $S_1$ alone, and this value may also be stored in the memory 35.

In a similar manner, to perform the calibration in the state where only the switch $S_2$ of the digital input switching circuit 42, corresponding to the second bit, is connected to the buffer 41, in the switch 31, the terminal 79 of the reference voltage $E_{r2}$ is connected to the amplifier 32, and the switch 49 is held OFF. By this operation, there is obtained a digital converted output $V_2$ of an error in the output from the D-A converter 24 when the input to the switching circuit 42 is connected to the switch $S_2$ alone. The same operation is carried out for each of the remaining switches $S_3$ to $S_6$; namely, they are individually connected to the buffer 41, and the differences between respective outputs from the D-A converter 24 and the reference voltage $E_{r2}$ are converted into digital values, and these digital converted values $V_3$ to $V_6$ of their errors obtained are stored in the memory 35. Also in this case, it is possible to calculate values $V_{a3}$ to $V_{a6}$ representing the respective outputs from the D-A converter 24 and store them in the memory 35. In this way, correction signals are predetermined and used for the converted output which is provided by the A-D conversion of the low-order digits of the input analog signal $E_x$. At the same time, they are also employed for correcting the offset voltage. Thus, a correct converted output can be obtained.

The output from the summing amplifier 13 is converted into a digital value $V_h$, with the switch 31 connected the variable attenuator 12, the switches $S_1$ to $S_6$ all grounded and the switch 49 held in the ON state. The value $V_h$ corresponds to the high-order digits of the digital output converted from the input analog value. That is, if the gain $G_2$ of the summing amplifier 13 at the time the switch 39 is turned ON is 1, and if the offset voltage $V_f$ of the summing amplifier 13 (including the offset of the state preceding it) is zero, then the digital value $V_h$ agrees with the input analog signal. This digital value $V_h$ is converted by the D-A converter 24 to an analog signal. When the above-mentioned gain $G_2$ of the summing amplifier 13 is not 1 and the offset voltage $F_f$ fluctuates, these values are measured for correcting them. Namely, by converting the output from the summing amplifier 13 to a digital value with the switch 31 grounded, the switches $S_1$ to $S_6$ also grounded and the switch 49 held in the ON state, the offset value $V_f$ is obtained and stored in the memory 35. Further, the output from the summing amplifier 13 is converted to a digital value in the state in which the switch 31 is connected to the terminal 78 supplied with the reference voltage $E_{r1}$, the switches $S_1$ to $S_6$ are all grounded and switch 49 is held ON. From this digital value the offset voltage $V_f$ previously obtained is subtracted and the difference is divided by the reference voltage $E_{r1}$, whereby the gain $G_2$ is obtained and stored in the memory 35.

By calculating $(V_h-V_f)/G_2$ from the values $V_f$ and $G_2$ thus obtained and the first digital value $V_h$ converted from the input analog signal, a high-order digit output $E_h$ of the digital converted output of the input analog signal, in which the gain and offset of the summing amplifier 13 have been corrected, is obtained. This output $E_h$ is converted by the D-A converter 24 to analog form, and further, the difference between the analog output and the input analog signal is converted to digital form. That is, in the state in which the switch 31 is connected to the output side of the variable attenuator 12, the switch 34 is connected to the side of the reference voltage of the same polarity as the input analog signal at the input terminal 11, the switches $S_1$ to $S_6$ are each designated by the above-mentioned high-order digit output to be connected to either the buffer circuit 41 or to ground and the switch 49 is turned OFF, the output from the summing amplifier 13 is converted into a digital value. Letting the digital value be represented by $V_l$, $(V_l-V_{of})/G_1$ is calculated from the offset value $V_{of}$ and the gain $G_1$ obtained previously. Moreover, the sum of errors $(V_i-V_{of}/G_1)$ ($i=1, 2, \ldots 6$) for each of the switches $S_1$ to $S_6$ which were connected to the side of the buffer circuit 41 when the high-order digit output $E_h$ was converted by the D-A converter 24 is calculated. The calculated result is added to $(V_l-V_{of})/G_1$ to compensate, and as a result, a low-order digit output $E_l$ of the digital converted output of the input analog signal is provided. Accordingly, if the error is stored as $(V_i-V_{of})/G_1$ in the memory 35, then the subsequent calculation is easy. As described previously, in the case where the values $V_{a1}$ to $V_{a6}$ are prestored in the memory 35, the values $V_{a1}$ to $V_{a6}$ for each of the switches $S_1$ to $S_6$ which were connected to the side of the buffer circuit 41 in the conversion of the high-order digit output $E_h$ by the D-A converter 24 are added together, and the resulting value is added to $V_l-V_{of})/G_1$, to obtain a digital converted $E_h+E_l$ of the input analog signal.

As described above, in the present invention, a reference voltage corresponding to each weight for the D-A converter 24 is prepared, and prior to the converting operation, an error in the D-A converter 24 is calculated using the reference value. The error is stored and, during operation, utilized as a correction signal to correct the actual converted output, whereby conversion can be achieved with high accuracy. In such a case, the resistance values $R_1$ to $R_6$ of the D-A converter 24 and the resistance value of the feedback register $R_7$ need not be preselected with predetermined high accuracy values. Further, there is no need to employ resistors having particularly high stability. In the reference voltage source 33, the resistors 55 to 57, 59 and 61 to 63 are respectively required to have highly accurate and stable resistance values, but the resistors other than resistors 61 to 63 are provided to obtain the reference voltage $+E_r$ and $-E_r$ which are employed in the A-d conversion; therefore, only the three resistors 61 to 63 are required to have highly accurate and stable resistance values. As compared with the prior art, in which resistors of the D-A converter must be highly accurate, the present invention reduces the number of resistors required to have highly accurate and stable values. Consequently, the number of calibration operations for such highly accurate resistance values is small, and in addition, the A-D converter can be manufactured at low cost as a whole.

In the illustrated embodiment, the reference voltages $E_{r2}$ and $E_{r3}$ for the respective weights of the D-A converter 24 are required for obtaining the correction signal, but it is preferred to reduce the number of reference voltages. In FIG. 3, the D-A conversion is effected using only two kinds of weights, i.e. 1 and 2. To this end, the input digital signal to the D-A converter differs from a digital output of ordinary A-D conversion in bit configuration, that is, in the weight of each bit and the number of bits. In this case, however, a coordinate index table is prepared and accessed by the converted high-order digit digital signal $V_h$ or $E_h$, and the switches $S_1$ to $S_6$ of the D-A converter 24 are controlled by the output from the index table. This operation can be achieved with ease. The D-A converter 24 is not limited specifically to the type having the weights shown in FIG. 3 but may also be of some other types having weights, for example, 1, 2, 4, 8 and so forth.

For example, in the case of periodically sampling an input analog signal and converting the sample values into digital signals, if any one of the aforesaid measurement of offset, measurement of gain and measurement for obtaining the correction signal for one of the switches of the D-A converter is performed for each conversion, and if the objects to be measured are sequentially changed for each conversion, then they are each measured every several seconds. In this case, if a change in the resistance value in several seconds is very small, a highly accurate A-D conversion takes place. The change in the resistance value in several seconds is negligible even if a very inexpensive resistor is employed, so that an A-D converter output of high accuracy can be obtained at all times. Thus, there is no need to use resistors capable of stable operation.

If the gains $G_1$ and $G_2$ do not fluctuate much and are predetermined, then their measurement can be omitted. Likewise, if the offset values $V_{of}$ and $V_f$ are sufficiently small, or if these values are predetermined and their drift is sufficiently small, then the measurement of these values can also be omitted. In FIG. 3, it is possible to leave out the adder 43 and connect directly to the connection point of the resistors 46 and 47. In this case, the reference voltage selected by the switch 34 is reversed in polarity from the input analog signal.

Figure 5:
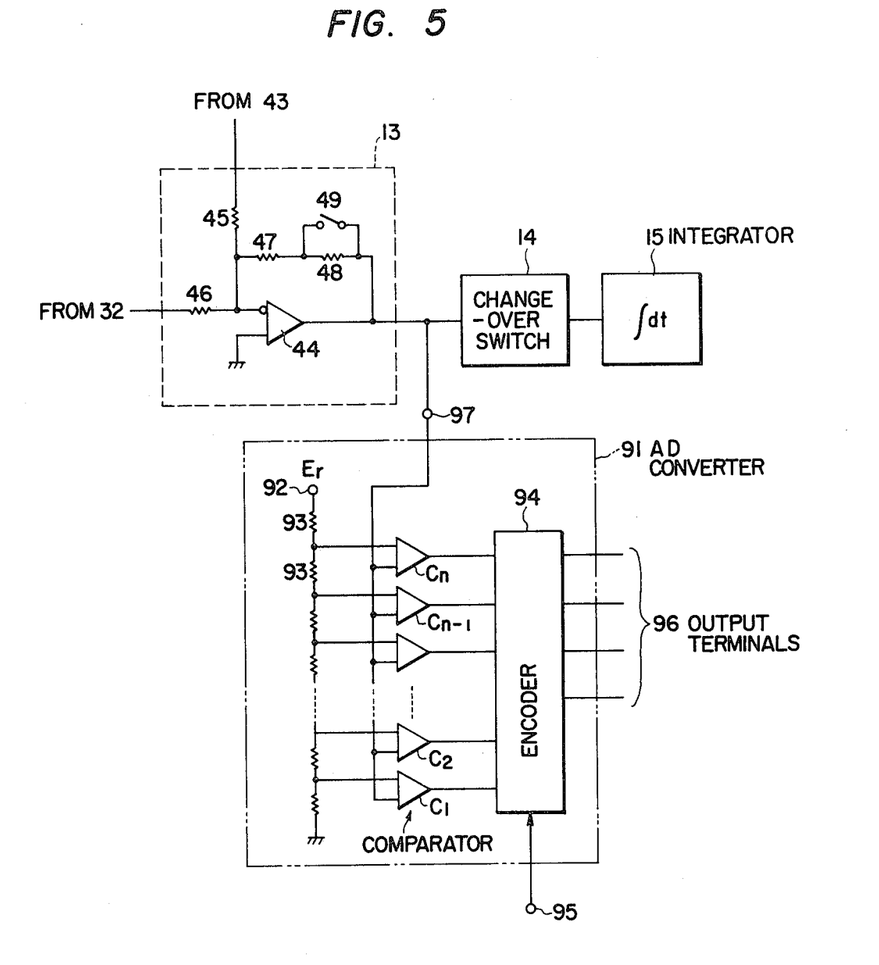
FIG. 5 is a circuit diagram showing a part of another embodiment of this invention which employs a comparison type A-D converter for obtaining a high-order output.

In the above embodiment, an integration type A-D converter is used to obtain the high-order digit output in digital form, but since the accuracy of the conversion therefore need not be very high and need only be about three digits, it is also possible to reduce the converting operation as a whole through utilization of a comparison type A-D converter. For example, as shown in FIG. 5, a comparison type A-D converter 91 is connected to the output side of the summing amplifier 13. The output from the summing amplifier 13 is provided to one input of each of comparators $C_l$ to $C_n$. A terminal 92 supplied with the reference voltage $E_r$ is grounded via a series circuit of (n+1) resistors 93 having the same resistance values. Voltage divided outputs derived at the connection points of the resistor 93 are respectively applied to the other inputs of the comparators $C_l$ to $C_n$. The outputs from the comparators $C_l$ to $C_n$ are provided to an encoder 94. When a latch command is applied to the encoder 94 from the control circuit 16 via a terminal 95, an encoded digital signal corresponding to the input at that time is latched in the encoder 94. This digital signal is provided therefrom via its output terminal 96 and the control circuit 16 to the central processor 38, wherein it is used as the aforementioned $V_h$. Since the A-D converter 91 is capable of achieving the converting operation at high speed, the whole operation for converting the input analog signal to digital form can also be made high-speed by the arrangement of FIG. 5.

It will be apparent that many modifications and variations may be effected without departing from the scope of the novel concepts of this invention.

What is claimed is:

1. An A-D converter comprising:
   means for providing an input analog signal;
   first A-D converting means for converting the input analog signal to a first digital signal to obtain a highorder digit output;
   A-D converting means, operatively connected to said first A-D converting means, for re-converting the first digital signal to an analog signal;
   amplifying means, operatively connected to said D-A converting means, for amplifying the difference between the reconverted analog signal and the input analog signal;
   second A-D converting means, operatively connected to said amplifying means, for converting the amplified difference signal to a second digital signal to obtain a low-order digit output;
   reference voltage means, operatively connected to said amplifying means, for providing a reference voltage for the converted output available from said D-A converting means when an input is applied thereto for each one of its bits, one at a time;
   control means, operatively connected to said D-A converting means, said reference voltage means and said second A-D converting means, for determining the difference between the converted output from the D-A converting means, when the input thereto is applied for each bit, and the corresponding reference voltage from the reference voltage means, said second A-D converting means converting the difference to a third digital signal to obtain an error signal for each bit of said D-A converting means;
   memory means, operatively connected to said second A-D converting means, for storing the third digital signal corresponding to the error signal; and
   calculating means, operatively connected to said memory means, for performing a corrective calculation for the low-order digit output using the error signal.

2. An A-D converter according to claim 1, wherein said calculating means includes means for dividing the error signal by the gain of said amplifying means, wherein said memory means includes means for storing the result of division of the error signal by the gain of said amplifying means, and wherein said calculating means includes means for algebraically adding the low-order digit output to the stored error signal corresponding to the bit of the high-order digit output inputted to said D-A converting means.

3. An A-D converter according to claim 1 or 2, further comprising:
means for applying a predetermined voltage to said amplifying means, said second A-D converting means including means for converting the output of said amplifying means to a digital value; and
means for dividing the converted output by the predetermined votage to obtain the gain of said amplifying means.

4. An A-D converter according to claim 1, wherein said calculating means includes means for dividing the error signal by the gain of the amplifying means, wherein said memory means includes means for storing the difference between the division result and the corresponding reference voltage value for each bit of the D-A converting means, and wherein said calculating means further includes means for dividing the low-order digit output by the gain of the amplifying means and means for adding the division result and the sum of stored values of the memory means corresponding to the bits of the high-order digits output inputted to the D-A converting means to obtain a final converted value.

5. An A-D converter according to claim 1, wherein said calculating means includes means for subtracting an offset voltage including the amplifying means from the error signal, wherein said memory means includes means for storing a value obtained by dividing the subtraction result by the gain of the amplifying means, and wherein the calculating means utilizes the value stored in said memory means.

6. An A-D converter according to claim 1, wherein said calculating means includes means for subtracting an offset voltage, including the amplifying means, from the error signal, and means for dividing the subtraction result by the gain of the amplifying means, wherein said memory means includes means for storing a value obtained by subtracting the division result from the corresponding reference voltage, and wherein said calculating means further includes means for subtracting the offset voltage from the low-order digit output, means for dividing the subtraction result by the gain of the amplifying means, and means for adding the division result and the sum of stored values of the memory means corresponding to the bits of the high-order digit output inputted to the D-A converting means to obtain a final converted value.

7. An A-D converter according to claim 1, 2, 4, 5 or 6, wherein said first and second A-D converting means comprise an integration type A-D converter.

8. An A-D converter according to claim 1, 2, 4, 5 or 6, wherein said first A-D converting means comprises a comparison type A-D converter, and wherein the second A-D converting means comprises an integration type A-D converter.

9. An A-D converter according to claim 1, 2, 4, 5 or 6, wherein said control means and said calculating means are formed by a microcomputer which performs the calculations of the calculating means.

* * * * *

UNITED STATES PATENT AND TRADEMARK OFFICE
CERTIFICATE OF CORRECTION

PATENT NO. : 4,315,254
DATED : February 9, 1982
INVENTOR(S) : HONJYO ET AL.

It is certified that error appears in the above—identified patent and that said Letters Patent is hereby corrected as shown below:

Front page, [73] Assignee, "Kabushiki Kaisha" should be
--Kabushikikaisha--;
Front page, between "[22]" and "[51]" insert --[30] Foreign
Application Priority Data
Jan. 29, 1979 [JP] JAPAN 54/9573/79--;
Front page, [57] ABSTRACT, line 11, after "circuit"
insert --,--.

Column 4, line 62, "was" should be --is--.
Column 5, line 18, after "by" insert --a--.
Column 6, line 19, "42" should be --43--;
        line 46, "purpose" should be --purposes--.
Column 8, line 43, "of" should be --from--;
        line 44, "from" should be --of--.
Column 9, line 14, after "first" insert --bit is converted
to digital--; and delete ",";
        line 44, "their" should be --the--.

UNITED STATES PATENT AND TRADEMARK OFFICE
CERTIFICATE OF CORRECTION

PATENT NO. : 4,315,254
DATED : February 9, 1982
INVENTOR(S) : HONJYO ET AL.

It is certified that error appears in the above—identified patent and that said Letters Patent is hereby corrected as shown below:

Column 10, line 51, "$V_\ell$" should be --$(V_\ell$--.
Column 11, line 1, "voltage" should be --voltages--;
line 2, "A-d" should be --A-D--;
line 67, "$C_\ell$" should be --$C_1$--.
Column 12, line 3, "resistor" should be --resistors--;
line 4, "$C_\ell$" should be --$C_1$--;
line 5, "$C_\ell$" should be --$C_1$--;
line 26, "A-D" should be --D-A--.
Column 14, line 24, "the" should be --said--.

Signed and Sealed this

Eighth Day of June 1982

[SEAL]

Attest:

GERALD J. MOSSINGHOFF

Attesting Officer

Commissioner of Patents and Trademarks